United States Patent [19]

Kumurdjian

[11] Patent Number: 5,169,713
[45] Date of Patent: Dec. 8, 1992

[54] HIGH FREQUENCY ELECTROMAGNETIC RADIATION ABSORBENT COATING COMPRISING A BINDER AND CHIPS OBTAINED FROM A LAMINATE OF ALTERNATING AMORPHOUS MAGNETIC FILMS AND ELECTRICALLY INSULATING

[75] Inventor: Pierre Kumurdjian, Saint-Cheron, France

[73] Assignee: Commissariat a l'Energie Atomique, Paris, France

[21] Appl. No.: 654,664

[22] Filed: Feb. 13, 1991

[30] Foreign Application Priority Data

Feb. 22, 1990 [FR] France ............... 90 02194

[51] Int. Cl.$^5$ ................ B32B 9/00
[52] U.S. Cl. ................ 428/323; 428/327; 428/328; 428/402; 428/692; 342/1; 427/128
[58] Field of Search .......... 428/692, 323, 327, 328, 428/403, 402; 342/1, 2, 3, 4; 427/128

[56] References Cited

U.S. PATENT DOCUMENTS

| | | | |
|---|---|---|---|
| 2,923,934 | 2/1960 | Halpern | 343/18 |
| 2,992,426 | 7/1961 | Borcherdt | 343/18 R |
| 3,375,091 | 3/1968 | Feldkeller | 428/632 |
| 3,540,047 | 11/1970 | Walser et al. | 343/18 |
| 3,843,593 | 10/1974 | Shell et al. | 260/40 R |
| 3,887,920 | 6/1975 | Wright et al. | 343/18 A |
| 3,938,152 | 2/1976 | Grimes et al. | 343/18 A |
| 4,003,840 | 1/1977 | Ishino et al. | 252/62 |
| 4,006,479 | 2/1977 | LaCombe | 343/18 A |
| 4,173,018 | 10/1979 | Dawson | 343/18 A |
| 4,378,322 | 3/1983 | Atterbury et al. | 264/24 |
| 4,606,848 | 8/1986 | Bond | 252/511 |
| 4,608,297 | 8/1986 | Shimada et al. | 428/215 |
| 4,624,798 | 11/1986 | Gindrup et al. | 252/62.54 |
| 4,624,865 | 11/1986 | Gindrup et al. | 427/126.2 |
| 4,777,205 | 10/1988 | La Scola et al. | 524/440 |
| 4,847,161 | 7/1989 | Rupp | 428/450 |
| 4,862,174 | 8/1989 | Natio et al. | 342/1 |
| 4,886,714 | 12/1989 | Torii et al. | 428/694 |
| 4,920,013 | 4/1990 | Kobayashi et al. | 428/694 |

FOREIGN PATENT DOCUMENTS 55-133507 10/1980 Japan .

Primary Examiner—Paul J. Thibodeau
Assistant Examiner—Stevan A. Resan
Attorney, Agent, or Firm—Kerkam, Stowell, Kondracki & Clarke

[57] ABSTRACT

Radiation absorbent coating and process for its production.

The radiation absorbent coating comprises a binder and chips able to absorb ultrahigh frequency electromagnetic radiation. The chips comprise a series of layers alternately constituted by electrically insulating layers (16, 20) and layers (14, 18) made from a stack of films of alternating amorphous magnetic films (50) and electrically insulating films (60) each from 2-5 nanometers thick.

10 Claims, 1 Drawing Sheet

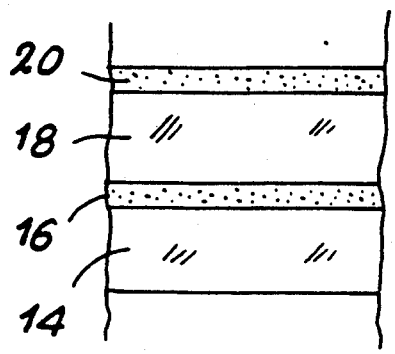
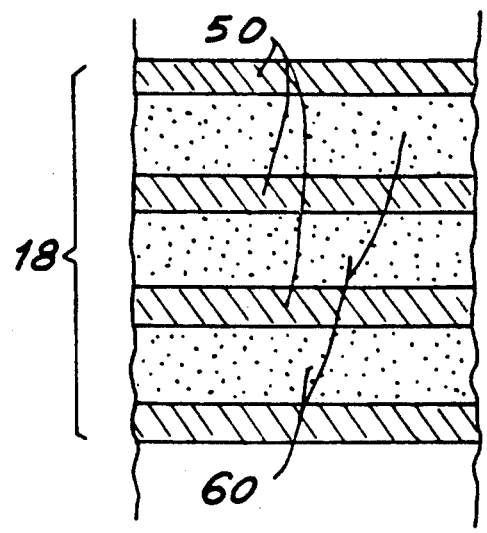
FIG. 1A  FIG. 1B
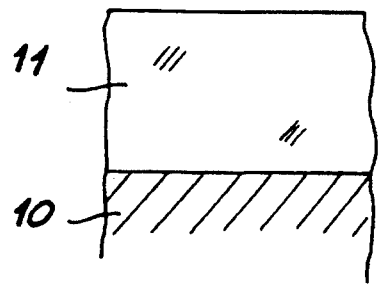
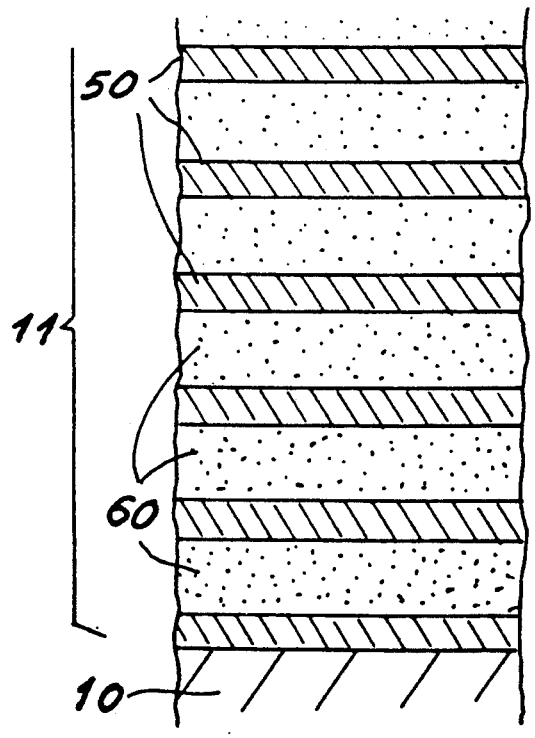
FIG. 2A  FIG. 2B

HIGH FREQUENCY ELECTROMAGNETIC RADIATION ABSORBENT COATING COMPRISING A BINDER AND CHIPS OBTAINED FROM A LAMINATE OF ALTERNATING AMORPHOUS MAGNETIC FILMS AND ELECTRICALLY INSULATING

BACKGROUND OF THE INVENTION

The present invention relates to an absorbent layer, its production process and to a covering obtained with the aid of the said layer.

French Patent Application EN 88 00495 (U.S. application Ser. No. 300,649) describes and claims an absorbent layer, which is characterized in that it comprises a binder and a charge constituted by chips formed from at least one film able to absorb electromagnetic radiation.

When it is a question of absorbing radiation in the microwave range, each chip is constituted by a stack of alternately magnetically amorphous and electrically insulating films. Preferably, the amorphous magnetic material is a ferromagnetic material with a high magnetic permeability.

The magnetic films can be between 100 and 1000 nm thick. The insulating films can be between 1 and 200 nm thick.

SUMMARY OF THE INVENTION

When absorbing an ultra-high frequency electromagnetic wave, i.e. in the range from 50 MHz to several dozen gigahertz, the chip can have a special structure and this forms the object of the present invention. In order to permit the propagation of the electromagnetic wave into the layer with a low reflection level, the chips must be electrically insulated in the binder. In order to remove this constraint and the dimensional aspects of the chip with respect to the frequency it is possible to produce a chip with the aid of a high resistivity amorphous material. This will give freedom from the dimensional requirements concerning the chips.

A high resistivity, amorphous magnetic coating can be obtained by using an amorphous magnetic material in the form of an ultra-thin film with thickness of a few nanometres. This type of ultra-thin film has a very high permeability and higher than that of the conventional thin films with a thickness exceeding 100 nm. On said magnetic film is then superimposed an ultra-thin insulating film, e.g. with a thickness of a few nanometres. This is followed by the deposition of an ultra-thin magnetic film and so on. This gives what is called a "substrack" (as opposed to the main stack) formed from several hundred ultra-thin films. The resulting composite will serve as the thin magnetic film in the sense of the aforementioned citation.

It is also possible to have a very significant thickness of ultra-thin films, because the resistivity of said composite is sufficiently high that it is possible to do without "thick" insulating films. The substack of ultra-thin films will then itself form the absorbent thin coating.

The resistivity of the composite must exceed a few ohm-cm (e.g. 5). Ultra-thin cobalt alloy films with silica have led to a gain of a factor of 10 compared with the resistivity of the alloy alone. The supplementary resistivity gain is obtained by a careful compromise between the thickness of the alloy and that of the insulant.

It is also possible to use other insulants, e.g. carbon (in the form of a very fine, uniform deposit) or organic materials. It is also possible to take special measures during deposition (substrate inclination, roughness, etc).

Finally, it is possible to simultaneously deposit the magnetic and insulating materials if the films obtained are formed from seperate magnetic and insulating microranges leading to an equivalent structure to the alternating ultra-thin film substack.

More specifically, the invention relates to an absorbent layer incorporating a binder and a charge constituted by chips able to absorb electromagnetic radiation, characterized in that each chip comprises at least one substack of ultra-thin amorphous magnetic films and ultra-thin insulating films.

In a first variant, each chip comprises a stack of coatings alternately constituted by the said substack of films and electrically insulated films.

In a second variant, each chip solely comprises the said substack.

The invention also relates to a process for the production of an absorbent layer, incorporating the stages of the vaccuum deposition of a substrate of a stack able to absorb electromagnetic radiation, the breaking up of said stack in order to reduce it into chips and the mixing of said chips with a binder, characterized in that, for depositing the said stack on the substrate, at least one substack of ultra-thin amorphous magnetic films and ultra-thin insulating films is deposited.

In a first variant, on the said substrate are alternately deposited said substack and the elctrically insulating films.

In a second variant, only the said substack is deposited on the substrate.

Finally, the present invention relates to an absorbent covering, characterized in that it comprises at least one layer as defined hereinbefore.

BRIEF DESCRIPTION OF THE DRAWINGS

The invention is described in greater detail hereinafter relative to non-limitative embodiments and the attached drawings, wherein show:

FIG. 1A shows a series of layers according to a preferred embodiment of the present invention;

FIG. 1B shows a stack of films according to the FIG. 1A preferred embodiment of the present invention;

FIG. 2A shows a layer and substrate according to an alternate embodiment of the present invention; and FIG. 2B shows a more detailed view of the alternate embodiment of FIG. 2A and shows various films within a layer of the structure of FIG. 2A.

FIG. 1A shows a structure having alternating amorphous magnetic layers 14 and 18 and electrically insulating layers 16 and 20. According to this preferred embodiment of the invention, each of the magnetic layers 14 and 18 would be formed as shown for layer 18 in FIG. 1B. Specifically, each of the magnetic layers would include a stack of amorphous magnetic films 50 and insulating films 60.

FIG. 2A shows an alternate embodiment wherein a single layer 11 is deposited on the substrate 10. The layer 11 is constituted by a stack of alternating ultra-thin magnetic films 50 and insulating films 60 as shown in FIG. 2B.

The ultra-thin amorphous magnetic films 50 can be a few nanometres thick, preferably approximately 3 nm. The ultra-thin insulating film 60 can be a few nanometres thick, preferably approximately 5 nm.

The insulant can be of carbon or an organic material.

I claim:

1. Absorbent coating comprising a binder and a charge constituted by chips able to absorb electromagnetic radiation, wherein each of said chips comprises a stack of films alternately constituted by an amorphous magnetic film and an insulating film of electrically insulating material, each of said magnetic and insulating films having a thickness of from about 2 to 5 nanometers and wherein the resistivity of the stack of films exceeds approximately 5 ohm-cm.

2. Absorbent coating comprising a binder and a charge constituted by chips able to absorb electromagnetic radiation, wherein each of said chips comprise a series of layers alternately constituted by an electrically insulating layer and a layer made of a stack of films, said stack of films alternately constituted by an amorphous magnetic film and an insulating film of electrically insulating material, each of said magnetic and insulating films having a thickness of from about 2 to 5 nanometers and wherein the resistivity of the stack of films exceeds approximately 5 ohm-cm.

3. Absorbent coating according to claim 1 or 2, wherein the thickness of each of said amorphous magnetic films is approximately 3 nm.

4. Absorbent coating according to claim 1 or 2, wherein the thickness of each of said insulating films is approximately 5 nm.

5. Absorbent coating according to claim 1 or 2, wherein said insulating films are made of carbon.

6. Absorbent coating according to claim 1 or 2, wherein said insulating films are made of an organic material.

7. Absorbent layer comprising at least one layer of a coating according to claim 1 or 2.

8. Absorbent layer comprising at least one layer of a coating according to claim 1 or 2 and wherein said insulating films are selected from the group consisting of carbon and an organic material.

9. A process for the production of an absorbent coating able to absorb electromagnetic radiation comprising the steps of:
   depositing on a substrate a stack of films alternately constituted by an amorphous magnetic film and an insulating film of electrically insulating material, each of said magnetic and insulating films having a thickness of from about 2 to 5 nanometers, and wherein the resistivity of the stack of films exceeds approximately 5 ohm-cm,
   breaking up said stack to reduce it into chips, and mixing said chips with a binder.

10. A process for the production of an absorbent coating for absorbing electromagnetic radiation comprising the steps of:
    depositing on a substrate a series of layers alternately constituted by an electrically insulating layer and a layer made of a stack of films, said stack of films alternately constituted by an amorphous magnetic film and an insulating film of electrically insulating material, said magnetic and insulating films having a thickness of from about 2 to 5 nanometers, wherein the resistivity of the stack of films exceeds approximately 5 ohm-cm and breaking up said stack to reduce it into chips, and mixing said chips with a binder.

* * * * *